(12) United States Patent
Ohkawa et al.

(10) Patent No.: US 6,407,020 B1
(45) Date of Patent: Jun. 18, 2002

(54) CERAMICS COMPOSITION

(75) Inventors: Hiroshige Ohkawa; Toshio Sakurai, both of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/538,397

(22) Filed: Mar. 29, 2000

(30) Foreign Application Priority Data

Mar. 31, 1999 (JP) .............................. 11-091941

(51) Int. Cl.⁷ .............................. C03C 1/00; C03C 8/14
(52) U.S. Cl. .............................. 501/32; 501/17; 501/21; 501/66; 501/69
(58) Field of Search .............................. 501/17, 18, 21, 501/32, 66, 69

(56) References Cited

U.S. PATENT DOCUMENTS 5,998,037 A * 12/1999 Sridharan et al. .............. 501/18

FOREIGN PATENT DOCUMENTS

| DE | 37 20 314 | 9/1988 |
|---|---|---|
| JP | 5-178659 | 7/1993 |
| JP | 6-215627 | 8/1994 |
| JP | 6-215628 | 8/1994 |
| JP | 6-76253 | 9/1994 |
| JP | 2521124 | 5/1996 |
| JP | 10-139477 | 5/1998 |
| JP | 11-10652 | 1/1999 |
| JP | 11-60266 | 3/1999 |

* cited by examiner

*Primary Examiner*—Michael Marcheschi
(74) *Attorney, Agent, or Firm*—Oblon, Spivak, McClelland, Maier & Neustadt, P.C.

(57) ABSTRACT

There is disclosed a ceramics composition mainly comprising Ba-based glass and a quartz. The content of Ba-based glass is in a range of 55.0 to 69.4 wt %, the content of a quartz is in a range of 12.1 to 40.2 wt %, and the content of $Al_2O_3$ is 24.5 wt % or less. For the components of Ba-based glass, in terms of oxides, the content of BaO is in a range of 19 to 29 mol %, the content of $SiO_2$ is in a range of 62 to 72 mol %, the content of $Al_2O_3$ is in a range of 6 to 11 mol %, and the content of $B_2O_3$ per the total of 100 mol of BaO, $SiO_2$ and $Al_2O_3$ is in a range of 3 to 7 mol. Therefore, the sintering can be performed at a temperature equal to or less than the melting point of Ag, Cu, or an alloy mainly containing Ag or Cu, dielectric constant is low, but linear expansion coefficient is high, and the co-firing can be realized with other dielectric material and magnetic material which can be sintered at a low temperature.

13 Claims, 2 Drawing Sheets

CERAMICS COMPOSITION

BACKGROUND OF THE INVENTION

(1) Field of the Invention

The present invention relates to a ceramics composition, particularly to a dielectric ceramics composition which has low temperature sintering properties to such an extent that Ag, Cu, or an alloy mainly containing Ag or Cu can be used as an internal conductor, and which has a low dielectric constant and a high linear expansion coefficient.

(2) Description of the Related Art

In recent years, thick film forming processes such as a printing process and a sheet process have been used to manufacture chip components such as a chip capacitor, a chip inductor and a chip filter. Moreover, examples of an electronic device formed by co-firing a plurality of types of ceramics compositions different in material properties include an LC filter formed of a combination of a magnetic material and a dielectric material, a circuit substrate (element) incorporating a capacitor formed of a combination of a high dielectric material and a low dielectric material, and the like.

For example, for the capacitor formed by co-firing the high and low dielectric materials, the reduction of distribution capacity, and the like can be performed, as compared with the capacitor formed only of the high dielectric material. Moreover, as compared with the capacitor formed only of the low dielectric material, the capacity enlargement can be realized.

In the above-described electronic device, in order to enhance the loss properties, it is preferable to use low-resistance Ag, Cu, or the alloy mainly containing Ag or Cu as a conductor electrode. However, since such conductor metal has a low melting point, it is requested that the ceramics composition for use in the electronic device can be sintered at the melting point of the conductor metal or a lower temperature (has a low temperature sinterability).

Moreover, to co-fire a plurality of types of ceramics compositions, the linear expansion coefficients of the respective ceramics compositions have to be matched to some degrees. When there is a large difference of linear expansion coefficient, the sintered product is cracked. For example, in general ceramics compositions provided with perovskite structures such as oxide titanium, barium titanate and calcium titanate, tungsten bronze structures such as barium-rare earth-titanium oxide, spinel structures such as NiCuZn-based ferrite, and the like, the linear expansion coefficient is of the order of $80 \times 10^{-7}/°$ C. to $130 \times 10^{-7}/°$ C. Even in the ceramics composition provided with the low temperature sinterability by addition of glass or the like, the linear expansion coefficient is substantially the same as the original linear expansion coefficient (about $80 \times 10^{-7}/°$ C. to $130 \times 10^{-7}/°$ C.) In many of the conventional low-dielectric ceramics compositions mainly containing glass, however, the linear expansion coefficient is in a range of about $40 \times 10^{-7}/°$ C. to $80 \times 10^{-7}/°$ C., the linear expansion coefficient is lower than that of the dielectric material or magnetic material provided with the low-temperature sinterability by the addition of glass or the like, and there is a problem that when the materials are co-fired, the product is cracked.

SUMMARY OF THE INVENTION

The present invention has been developed in consideration of the above-described situations, and an object thereof is to provide a low-dielectric ceramics composition which has a low-temperature sinterability and can be sintered with an internal conductor alone, and which has a high linear expansion coefficient and can be co-fired with other ceramics compositions.

To attain this object, according to the present invention, there is provided a ceramics composition which mainly comprises Ba-based glass and α quartz. The content of the Ba-based glass is in a range of 55.0 to 69.4 wt %, the content of the α quartz is in a range of 12.1 to 40.2 wt %, and the content of $Al_2O_3$ is 24.5 wt % or less. For the components of the Ba-based glass, in terms of oxides, the content of BaO is in a range of 19 to 29 mol %, the content of $SiO_2$ is in a range of 62 to 72 mol %, the content of $Al_2O_3$ is in a range of 6 to 11 mol %, and the content of $B_2O_3$ per the total of 100 mol of BaO, $SiO_2$ and $Al_2O_3$ is in a range of 3 to 7 mol.

Moreover, in the ceramics composition of the present invention, the linear expansion coefficient is in a range of $80 \times 10^{-7}/°$ C. to $150 \times 10^{-7}/°$ C.

Furthermore, the ceramics composition of the present invention comprises the α quartz, and one of four types of crystal phases $[BaAl_2SiO_8+BaSi_2O_5]$, $[BaAl_2SiO_8+BaSi_2O_5+Al_2O_3]$, $[BaAl_2SiO_8+Al_2O_3]$ and $[BaSi_2O_5+Al_2O_3]$.

In the present invention, the sintering temperature of the ceramics composition is equal to or less than the melting point of Ag, Cu, or the alloy mainly containing Ag or Cu, and the dielectric constant is low, but the linear expansion coefficient is high. Therefore, the co-firing can be performed with different types of ceramics compositions such as the high dielectric material and magnetic material which can be sintered at a low temperature. By using low-melting metals such as Ag and Cu as the internal conductor, the composition can be used for manufacturing electronic devices such as a small-sized filter, a resonator and a circuit substrate.

DETAILED DESCRIPTION OF THE PREFERRED EMBODIMENTS

Figure 1:
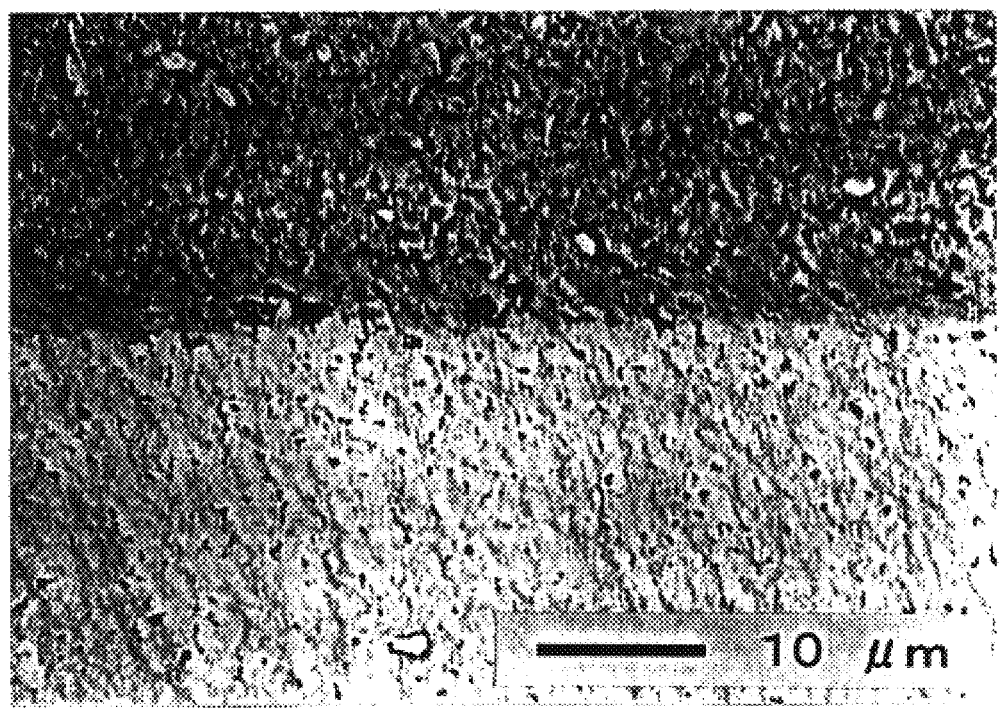
FIG. 1 is a scanning electron microscopic photograph as a substitute for a drawing which shows a broken boundary surface when a sample 8 is co-fired with a high dielectric material in a first embodiment

Embodiments of the present invention will next be described.

A ceramics composition of the present invention mainly comprises Ba-based glass and α quartz. In the ceramics composition of the present invention, the content of the Ba-based glass is in a range of 55.0 to 69.4 wt %, preferably 57.3 to 66.5 wt %, more preferably 61.1 to 66.5 wt %. The content of α quartz is in a range of 12.1 to 40.2 wt %, preferably 20.7 to 30.3 wt %, more preferably 21.0 to 26.0 wt %. Moreover, the content of $Al_2O_3$ is 24.5 wt % or less, preferably in a range of 6.4 to 18.6 wt %, more preferably 9.0 to 12.9 wt %.

When the content of Ba-based glass is less than 55.0 wt %, the low-temperature sinterability of the ceramics composition is deteriorated, and a dense sintered material (with a relative density of 92% or more after the sintering at 900° C.) cannot be obtained. Moreover, when the content exceeds 69.4 wt %, no dense sintered material can be obtained from the ceramics composition. On the other hand, when the content of Ba-based glass is in the most preferable range of 61.1 to 66.5 wt %, the ceramics composition has a low-temperature sinterability, and the dense sintered material can be obtained. Additionally, during the co-firing with the high dielectric material of barium-rare earth-titanium oxide which can be sintered at a low temperature of 900° C. or less, boundary reactive properties are enhanced, and neither continuous space nor pore is made in a boundary joining surface.

Moreover, when the content of α quartz is less than 12.1 wt %, the low-temperature sinterability of the ceramics composition is deteriorated, and no dense sintered material can be obtained. Furthermore, when the content exceeds 40.2 wt %, no dense sintered material can be obtained from the ceramics composition. On the other hand, when the content of α quartz is in the most preferable range of 21.0 to 26.0 wt %, the ceramics composition has a low-temperature sinterability, and the dense sintered material can be obtained. Additionally, during the co-firing with the high dielectric material of barium-rare earth-titanium oxide which can be sintered at a low temperature of 900° C. or less, the boundary reactive properties are enhanced, and neither continuous space nor pore is made in the boundary joining surface.

An additive of $Al_2O_3$ to the main component including Ba-based glass and α quartz has an effect of enhancing the shape retaining properties of the ceramics composition. However, when the addition amount exceeds 24.5 wt %, the low-temperature sinterability of the ceramics composition is deteriorated, and no dense sintered material can be obtained. On the other hand, when the addition amount of $Al_2O_3$ is in the most preferable range of 9.0 to 12.9 wt %, the ceramics composition has a low-temperature sinterability, and the dense sintered body can be obtained. Additionally, during the co-firing with the high dielectric material of barium-rare earth-titanium oxide which can be sintered at a low temperature of 900° C. or less, the boundary reactive properties are enhanced, and neither continuous space nor pore is made in the boundary joining surface.

The Ba-based glass in the ceramics composition of the present invention comprises components in the following ranges in terms of oxide.

BaO: 19 to 29 mol %, preferably 21 to 25 mol %
$SiO_2$: 62 to 72 mol %, preferably 64 to 70 mol %
$Al_2O_3$: 6 to 11 mol %, preferably 7 to 11 mol %
the amount of $B_2O_3$ per the total of 100 mol of BaO, $SiO_2$ and $Al_2O_3$: 3 to 7 mol, preferably 4 to 6 mol When the content of BaO is less than 19 mol % in Ba-based glass, vitrification is difficult. When it exceeds 29 mol %, no dense sintered material can be obtained from the ceramics composition.

Moreover, when the content of $SiO_2$ is less than 62 mol %, no dense sintered material can be obtained from the ceramics composition. When it exceeds 72 mol %, the vitrification is difficult.

Furthermore, when the content of $Al_2O_3$ is less than 6 mol %, or when it exceeds 11 mol %, no dense sintered material can be obtained from the ceramics composition.

When the content of $B_2O_3$ per the total of 100 mol of BaO, $SiO_2$ and $Al_2O_3$ is less than 3 mol %, the vitrification is difficult. When it exceeds 7 mol %, no dense sintered material can be obtained from the ceramics composition.

By appropriately setting the respective constituting components in the above-described ranges, the ceramics composition of the present invention is provided with the low-temperature sinterability, and the linear expansion coefficient can be in a range of $80 \times 10^{-7}$/° C. to $150 \times 10^{-7}$/° C. Therefore, it is easy to match the linear expansion coefficient with that of the conventional high dielectric material, magnetic material, and other different types of ceramics compositions which can be sintered at the melting point of low-resistance Ag, Cu, or the alloy mainly containing Ag or Cu or a lower temperature. Therefore, even when the co-firing with the different types of materials is performed, no crack is made in the obtained sintered material. Additionally, it is difficult to obtain the material with a linear expansion coefficient exceeding $150 \times 10^{-7}$/° C. from the ceramics composition of the present invention.

Furthermore, in the ceramics composition of the present invention, in addition to the control of the linear expansion coefficient by the above-described composition, the linear expansion coefficient can also be controlled in a range of $80 \times 10^{-7}$/° C. to $150 \times 10^{-7}$/° C. by the sintering temperature, and sintering time. In the sintering of Ba-based glass and α quartz, or in the sintering of these components with $Al_2O_3$ added thereto, glass crystallization occurs, and new crystal phases [$BaAl_2SiO_8$] and [$BaSi_2O_5$] are generated. Since these crystal phases have inherent linear expansion coefficients, the linear expansion coefficient can be controlled by changing the type and amount of the crystal phase in accordance with the sintering conditions.

The ceramics composition of the present invention comprises the α quartz, and one type of four types of crystal phases [$BaAl_2SiO_8+BaSi_2O_5$], [$BaAl_2SiO_8+BaSi_2O_5+Al_2O_3$], [$BaAl_2SiO_8+Al_2O_3$] and [$BaSi_2O_5+Al_2O_3$], has a low dielectric constant, but has a high linear expansion coefficient, and has a low-temperature sinterability.

A method of manufacturing the ceramics composition of the present invention will next be described.

First, the method comprises: preparing BaO, $SiO_2$, $Al_2O_3$ and $B_2O_3$ as Ba-based glass components; weighing and mixing predetermined amounts; melting the components in a crucible; quenching the molten material; and grinding the material to form glass powder. Additionally, glass raw materials do not have to be oxides. For example, even by using carbonate, hydroxide, sulfate, and other materials which are formed into oxides by heat treatment, the glass powder equivalent to that resulting from the use of oxides can be obtained.

For the mixing of the glass raw materials, for example, dry mixing can be performed, and the melting can be performed at 1500 to 1600° C. for 0.5 to 5 hours. For the grinding of the molten material, the wet grinding using a ball mill or the like is preferable.

Subsequently, the method comprises: preparing α quartz powder and Ba-based glass powder as the main components, and further $Al_2O_3$ powder as occasion demands; and weighing and mixing the predetermined amounts. By mixing, with the obtained powder, organic binders such as a polyvinyl alcohol-based binder, an acrylic binder, and an ethyl cellulose-based binder, and solvents, plasticizers, and the like as the occasion demands, a slurry is prepared.

Next, the method comprises: molding the slurry into a desired shape; and sintering the molded material. For the molding, wet molding such as a sheet process and a printing process, or dry molding such as press molding may be performed, and the molding method can appropriately be selected in accordance with the desired shape. The sintering temperature can be set in a range of 850 to 960° C., and the sintering time is preferably of the order of 0.1 to 24 hours. That is, the low-temperature sintering can be performed at the melting point of Ag, Cu, or the alloy mainly containing Ag or Cu or a lower temperature. Therefore, the electronic component can be constituted by using the low-resistance, low-melting metals such as Ag and Cu as the internal conductor. Additionally, the sintering atmosphere is preferably selected in accordance with the internal conductor for the co-firing. For example, in the co-firing with Ag, an oxygen atmosphere, such as air, is selected, and in the co-firing with Cu, a reduction atmosphere is selected.

Concrete examples will next be illustrated to describe the present invention in more detail.

EXAMPLE 1

First, $BaCO_3$, $SiO_2$, $Al_2O_3$ and $B_2O_3$ were weighed as the Ba-based glass components to obtain the composition shown in the column of the glass composition of the following Tables 1 to 3, and dry-mixed with a shaker, and the mixture was placed in the crucible, and molten at 1550° C. for one hour. Subsequently, the molten material was quenched with pure water, roughly ground with a automated mortar, and wet-ground in the ball mill to obtain Ba-based glass powder.

Subsequently, the Ba-based glass powder obtained as described above, α quartz powder, and $Al_2O_3$ powder were weighed and mixed to obtain the proportions shown in the column of the material composition in the following Tables 1 to 3. Added to 100 parts by weight of the mixed powder were 15 parts by weight of acrylic resin as the organic binder, 60 parts by weight of toluene as the solvent, and 5 parts by weight of n-butyl phthalyl-n-butyl glycolate (BPBG). Dispersion was performed in the ball mill, and 57 types of organic slurries were prepared.

Subsequently, the organic slurries were used to prepare 57 types of green sheets (samples 2 to 10, 12 to 59) by a doctor blade process. Subsequently, the green sheet was formed into a predetermined size in accordance with the following measurement conditions, and the sintering was performed at 900° C. for two hours.

Subsequently, for the above-described samples, the low-temperature sinterability (with a relative density of 92% or more after the sintering at 900° C.) was evaluated, the relative dielectric constant and linear expansion coefficient were measured by the following measurement method, and the contained crystal phase was measured in the following method. Results are shown in Tables 1 to 3.

Figure 2:
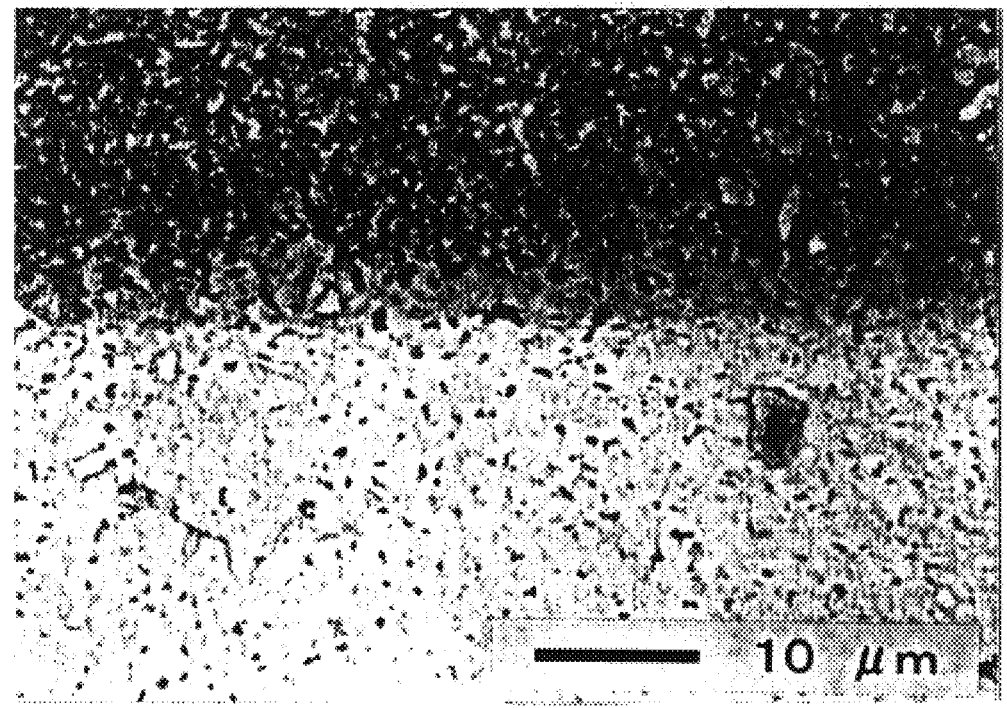
FIG. 2 is a scanning electron microscopic photograph as a substitute for a drawing which shows a broken boundary surface when a sample 23 is co-fired with the high dielectric material in the first embodiment.
Figure 3:
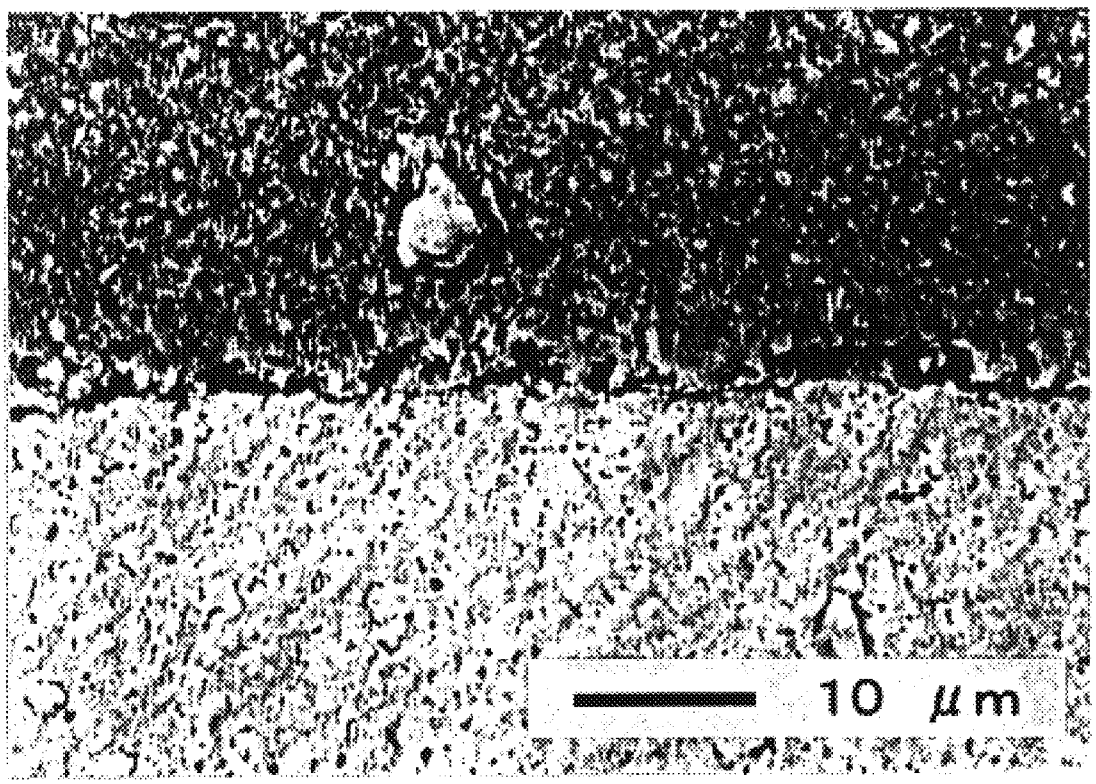
FIG. 3 is a scanning electron microscopic photograph as a substitute for a drawing which shows a broken boundary surface when a sample 41 is co-fired with a high dielectric material in the first embodiment.

Moreover, the samples 8, 23, 41 were integrally sintered with the high dielectric material of barium-rare earth-titanium oxide which can be sintered at a low temperature, the broken boundary surface was observed with a scanning electron microscopic apparatus (JED-2001 manufactured by Nihon Denshi Datum Co.), and the compo images (2000 times) of the boundary surface after the co-firing were photographed as shown in FIGS. 1 to 3.

Measurement Method of Relative Dielectric Constant

A bar-shaped sample with a square of about 1 mm was prepared, and the relative dielectric constant (2 GHz) was measured by a hollow resonator disturbance process (using 83620A, 8757C manufactured by Hewlett Packard).

Measurement Method of Linear Expansion Coefficient

A sample of about 4×4×28 mm was prepared, and the linear expansion coefficient (100 to 700° C.) was measured by a transverse type linear expansion apparatus (DL-7000Y-RH manufactured by Sinku Riko Kabushiki Kaisha).

Measurement Method of Crystal Phase

The sintered material was ground in a mortar, and measured by a powder X-ray diffraction process (using $MXP^3$ system manufactured by Mac Science Co.). For measurement conditions, Cu was used as a target, and 45 kV, 40 mA, 1 deg/min., 2θ=10° to 60° were set. Additionally, in the following Tables 1 to 3, characters α, A, B, C, D denote the following crystal phases, respectively.

α: α quartz
A: $BaAl_2SiO_8+BaSi_2O_5$
B: $BaAl_2SiO_8+BaSi_2O_5+Al_2O_3$
C: $BaAl_2SiO_8+Al_2O_3$
D: $BaSi_2O_5+Al_2O_3$

TABLE 1

| | Glass composition | | | | Material composition | | | Low- | Relative dielectric | Linear expansion | |
| | mol % | | | mol | (wt %) | | | temperature | constant | coefficient | Crystal |
| Sample | BaO | $Al_2O_3$ | $SiO_2$ | $B_2O_3$ | Ba glass | α quartz | $Al_2O_3$ | sinterability | (2 GHz) | (× $10^{-7}$/° C.) | phase |
|---|---|---|---|---|---|---|---|---|---|---|---|
| 1* | 17 | 9 | 74 | 5 | Vitrification is difficult | | | — | — | — | — |
| 2 | 19 | 9 | 72 | 5 | 61.1 | 26.0 | 12.9 | Satisfactory | 6.2 | 91 | α + C |
| 3 | 21 | 7 | 72 | 5 | 61.4 | 25.8 | 12.8 | Satisfactory | 6.3 | 107 | α + B |
| 4 | 21 | 9 | 70 | 5 | 61.7 | 25.6 | 12.7 | Satisfactory | 6.3 | 93 | α + C |
| 5 | 21 | 11 | 68 | 5 | 61.1 | 26.0 | 12.9 | Satisfactory | 6.2 | 90 | α + C |
| 6 | 23 | 6 | 71 | 5 | 62.1 | 25.3 | 12.6 | Satisfactory | 6.3 | 115 | α + B |
| 7 | 23 | 7 | 70 | 5 | 62.4 | 25.1 | 12.5 | Satisfactory | 6.4 | 112 | α + B |
| 8 | 23 | 9 | 68 | 5 | 62.0 | 25.4 | 12.6 | Satisfactory | 6.4 | 104 | α + B |
| 9 | 23 | 11 | 66 | 5 | 62.1 | 25.3 | 12.6 | Satisfactory | 6.3 | 93 | α + C |
| 10* | 23 | 12 | 65 | 5 | 61.7 | 25.6 | 12.7 | Not densified | — | 94 | — |
| 11* | 23 | 9 | 68 | 2 | Vitrification is difficult | | | — | — | — | — |
| 12 | 23 | 9 | 68 | 3 | 62.2 | 25.3 | 12.5 | Satisfactory | 6.4 | 89 | α + B |
| 13 | 23 | 9 | 68 | 4 | 62.1 | 25.3 | 12.6 | Satisfactory | 6.4 | 96 | α + B |
| 14* | 23 | 4 | 73 | 4 | Vitrification is difficult | | | — | — | — | — |
| 15* | 28 | 4 | 68 | 4 | 68.4 | 19.8 | 11.8 | Not densified | — | 110 | — |
| 16* | 33 | 4 | 63 | 4 | 68.7 | 19.6 | 11.7 | Not densified | — | 106 | — |
| 17 | 23 | 9 | 68 | 4 | 66.7 | 20.9 | 12.4 | Satisfactory | 6.6 | 88 | α + B |
| 18 | 25 | 9 | 66 | 4 | 66.8 | 20.8 | 12.4 | Satisfactory | 6.5 | 87 | α + B |

TABLE 1-continued

| | Glass composition | | | | Material composition | | | Low- | Relative dielectric | Linear expansion | |
| | mol % | | | mol | (wt %) | | | temperature | constant | coefficient | Crystal |
| Sample | BaO | Al$_2$O$_3$ | SiO$_2$ | B$_2$O$_3$ | Ba glass | α quartz | Al$_2$O$_3$ | sinterability | (2 GHz) | (× 10$^{-7}$/° C.) | phase |
|---|---|---|---|---|---|---|---|---|---|---|---|
| 19 | 27 | 9 | 64 | 4 | 67.5 | 20.4 | 12.1 | Satisfactory | 6.4 | 92 | α + B |
| 20 | 28 | 9 | 63 | 4 | 67.7 | 20.3 | 12.0 | Satisfactory | 6.4 | 97 | α + B |

The sample number with an asterisk mark denotes a comparative example.

TABLE 2

| | Glass composition | | | | Material composition | | | Low- | Relative dielectric | Linear expansion | |
| | mol % | | | mol | (wt %) | | | temperature | constant | coefficient | Crystal |
| Sample | BaO | Al$_2$O$_3$ | SiO$_2$ | B$_2$O$_3$ | Ba glass | α quartz | Al$_2$O$_3$ | sinterability | (2 GHz) | (× 10$^{-7}$/° C.) | phase |
|---|---|---|---|---|---|---|---|---|---|---|---|
| 21 | 29 | 9 | 62 | 4 | 67.9 | 20.1 | 12.0 | Satisfactory | 6.3 | 97 | α + B |
| 22* | 33 | 9 | 58 | 4 | 68.3 | 19.8 | 11.9 | Not densified | — | 100 | — |
| 23 | 23 | 9 | 68 | 5 | 66.5 | 21.0 | 12.5 | Satisfactory | 6.5 | 96 | α + B |
| 24 | 25 | 9 | 66 | 5 | 67.0 | 20.7 | 12.3 | Satisfactory | 6.4 | 101 | α + B |
| 25 | 27 | 9 | 64 | 5 | 67.5 | 20.4 | 12.1 | Satisfactory | 6.3 | 105 | α + B |
| 26 | 29 | 9 | 62 | 5 | 68.1 | 20.0 | 11.9 | Satisfactory | 6.3 | 104 | α + B |
| 27 | 23 | 9 | 68 | 6 | 66.4 | 21.0 | 12.6 | Satisfactory | 6.5 | 107 | α + B |
| 28 | 25 | 9 | 66 | 6 | 67.0 | 20.7 | 12.3 | Satisfactory | 6.4 | 108 | α + B |
| 29 | 27 | 9 | 64 | 6 | 67.6 | 20.3 | 12.1 | Satisfactory | 6.3 | 105 | α + B |
| 30 | 29 | 9 | 62 | 6 | 67.9 | 20.1 | 12.0 | Satisfactory | 6.3 | 103 | α + B |
| 31 | 23 | 9 | 68 | 7 | 66.3 | 21.1 | 12.6 | Satisfactory | 6.4 | 105 | α + B |
| 32 | 25 | 9 | 66 | 7 | 66.9 | 20.7 | 12.4 | Satisfactory | 6.3 | 105 | α + B |
| 33 | 27 | 9 | 64 | 7 | 67.3 | 20.5 | 12.2 | Satisfactory | 6.3 | 104 | α + B |
| 34 | 29 | 9 | 62 | 7 | 67.8 | 20.2 | 12.0 | Satisfactory | 6.3 | 103 | α + B |
| 35* | 28 | 9 | 63 | 8 | 67.8 | 20.2 | 12.0 | Not densified | — | 102 | — |
| 36* | 23 | 9 | 68 | 5 | 54.9 | 45.1 | 0.0 | Not densified | — | 122 | — |
| 37* | 23 | 9 | 68 | 5 | 53.7 | 39.7 | 6.6 | Not densified | — | 118 | — |
| 38* | 23 | 9 | 68 | 5 | 52.6 | 34.5 | 12.9 | Not densified | — | 113 | — |
| 39 | 23 | 9 | 68 | 5 | 59.8 | 40.2 | 0.0 | Satisfactory | 6.0 | 115 | α + A |
| 40 | 23 | 9 | 68 | 5 | 58.6 | 34.9 | 6.5 | Satisfactory | 6.1 | 115 | α + B |
| 41 | 23 | 9 | 68 | 5 | 57.3 | 29.9 | 12.8 | Satisfactory | 6.2 | 109 | α + B |

The sample number with an asterisk mark denotes a comparative example.

TABLE 3

| | Glass composition | | | | Material composition | | | Low- | Relative dielectric | Linear expansion | |
| | mol % | | | mol | (wt %) | | | temperature | constant | coefficient | Crystal |
| Sample | BaO | Al$_2$O$_3$ | SiO$_2$ | B$_2$O$_3$ | Ba glass | α quartz | Al$_2$O$_3$ | sinterability | (2 GHz) | (× 10$^{-7}$/° C.) | phase |
|---|---|---|---|---|---|---|---|---|---|---|---|
| 42 | 23 | 9 | 68 | 5 | 56.2 | 25.1 | 18.7 | Satisfactory | 6.4 | 105 | α + B |
| 43 | 23 | 9 | 68 | 5 | 55.0 | 20.5 | 24.5 | Satisfactory | 6.5 | 101 | α + B |
| 44 | 23 | 9 | 68 | 5 | 64.6 | 35.4 | 0.0 | Satisfactory | 6.1 | 117 | α + A |
| 45 | 23 | 9 | 68 | 5 | 63.3 | 30.3 | 6.4 | Satisfactory | 6.3 | 109 | α + B |
| 46 | 23 | 9 | 68 | 5 | 60.7 | 20.7 | 18.6 | Satisfactory | 6.6 | 99 | α + B |
| 47 | 23 | 9 | 68 | 5 | 59.5 | 16.3 | 24.2 | Satisfactory | 6.9 | 91 | α + B |
| 48* | 23 | 9 | 68 | 5 | 57.2 | 7.8 | 35.0 | Not densified | — | 74 | — |
| 49* | 23 | 9 | 68 | 5 | 55.1 | 0.0 | 44.9 | Not densified | — | 62 | — |
| 50 | 23 | 9 | 68 | 5 | 69.4 | 30.6 | 0.0 | Satisfactory | 6.2 | 106 | α + A |
| 51 | 23 | 9 | 68 | 5 | 67.9 | 25.7 | 6.4 | Satisfactory | 6.4 | 99 | α + B |
| 52 | 23 | 9 | 68 | 5 | 66.5 | 21.0 | 12.5 | Satisfactory | 6.5 | 96 | α + B |
| 53 | 23 | 9 | 68 | 5 | 65.2 | 16.4 | 18.4 | Satisfactory | 6.7 | 91 | α + B |
| 54 | 23 | 9 | 68 | 5 | 63.9 | 12.1 | 24.0 | Satisfactory | 7.0 | 85 | α + B |
| 55* | 28 | 9 | 63 | 4 | 72.5 | 21.2 | 6.3 | Not densified | — | 95 | — |
| 56* | 28 | 9 | 63 | 4 | 71.0 | 16.6 | 12.4 | Not densified | — | 106 | — |
| 57* | 28 | 9 | 63 | 6 | 74.2 | 24.5 | 1.3 | Not densified | — | 115 | — |
| 58* | 28 | 9 | 63 | 6 | 73.0 | 20.8 | 6.2 | Not densified | — | 87 | — |
| 59* | 28 | 9 | 63 | 6 | 71.6 | 16.3 | 12.1 | Not densified | — | 99 | — |

The sample number with an asterisk mark denotes a comparative example.

As shown in Tables 1 to 3, for the samples (2 to 9, 12, 13, 17 to 21, 23 to 24, 39 to 47, 50 to 54) which mainly contain Ba-based glass and α quartz, and in which the respective constituting components are in the ranges of the present invention, any sample is superior in the low-temperature sinterability, the sintering can be performed at the temperature equal to or less than the melting point of Ag, Cu, or the alloy mainly containing Ag or Cu, the dielectric constant is low (7 or less (2 GHz)), and the linear expansion coefficient is in the range of $80 \times 10^{-7}/°$ C. to $130 \times 10^{-7}/°$ C.

Furthermore, among the above-described samples 8, 23, 41, for the samples 8 and 23 (see FIGS. 1 and 2) in which the content of Ba-based glass is in a range of 61.1 to 66.5 wt %, the content of α quartz is in a range of 21.0 to 26.0 wt %, and the content of $Al_2O_3$ is in a range of 9.0 to 12.9 wt %, during the co-firing with the high dielectric material of barium-rare earth-titanium oxide which can be sintered at the low temperature, the boundary reactive properties are particularly satisfactory, as compared with the sample 41 (see FIG. 3).

On the other hand, for the sample 1 in which the content of BaO is less than 19 mol % in the glass composition, the sample 11 in which the content of $B_2O_3$ per the total of 100 mol of BaO, $SiO_2$ and $Al_2O_3$ is less than 3 mol, and the sample 14 in which the content Of $SiO_2$ exceeds 72 mol %, the vitrification is difficult, and no ceramics composition is obtained.

Moreover, for the other samples in which the contents of the constituting components depart from the ranges of the present invention, no sample is densified in the sintering in 900° C., and the relative density is less than 92%.

EXAMPLE 2

First, the organic slurry with the same composition as the samples 39 to 43 in the first example was prepared similarly to the first example.

Subsequently, the above-described organic slurry was used to prepare five types of green sheets (samples A to E) similarly to the first example, and subsequently, the green sheets was formed in the predetermined size as that of the first example, and sintered on two types of conditions: 880° C. and two hours; and 920° C. and two hours.

Then, with respect to the above-described samples, the linear expansion coefficient was measured similarly to the first example, and results are shown in Table 4. Additionally, the measurement results of the samples 39 to 43 (the sintering of 900° C. for two hours) in the first example are also shown in Table 4.

What is claimed is:

1. A ceramics composition, which comprises:

55.0 to 69.4 wt % of Ba-based glass; 12.1 to 40.2 wt % of α quartz; and 24.5 wt % or less of $Al_2O_3$, said Ba-based glass comprising, in terms of oxides, 19 to 29 mol % of BaO; 62 to 72 mol % of $SiO_2$; 6 to 11 mol % of $Al_2O_3$; and 3 to 7 mol of $B_2O_3$ with respect to 100 mol of the total of BaO, $SiO_2$ and $Al_2O_3$.

2. The ceramics composition according to claim 1, which composition has a linear expansion coefficient in a range of $80 \times 10^{-7}/°$ C. to $150 \times 10^{-7}/°$ C.

3. The ceramics composition according to claim 1, wherein the ceramics composition comprises a α quartz crystal phase, and one additional crystal phase selected from the group consisting of $[BaAl_2SiO_8+BaSi_2O_5]$, $[BaAl_2SiO_8+BaSi_2O_5+Al_2O_3]$, $[BaAl_2SiO_8+Al_2O_3]$ and $[BaSi_2O_5+Al_2O_3]$.

4. The ceramics composition according to claim 1, comprising 57.3 to 66.5 wt % of the Ba-based glass.

5. The ceramics composition according to claim 1, comprising 61.1 to 66.5 wt % of the Ba-based glass.

6. The ceramics composition according to claim 1, comprising 20.7 to 30.3 wt % of α quartz.

7. The ceramics composition according to claim 1, comprising 21.0 to 26.0 wt % of α quartz.

8. The ceramics composition according to claim 1, comprising 6.4 to 18.6 wt % of $Al_2O_3$.

9. The ceramics composition according to claim 1, comprising 9.0 to 12.9 wt % of $Al_2O_3$.

10. The ceramics composition according to claim 1, wherein said Ba-based glass comprises 21 to 25 mol % of BaO.

11. The ceramics composition according to claim 1, wherein said Ba-based glass comprises 64 to 70 mol % of $SiO_2$.

12. The ceramics composition according to claim 1, wherein said Ba-based glass comprises 7 to 11 mol % of $Al_2O_3$.

TABLE 4

| | Glass composition mol % | | | | Material composition mol (wt %) | | | Linear expansion coefficient ($\times 10^{-7}/°$ C.) | | |
|---|---|---|---|---|---|---|---|---|---|---|
| | | | | | | | | Sintering temperature | Sintering temperature | Sintering temperature |
| Sample | BaO | $Al_2O_3$ | $SiO_2$ | $B_2O_3$ | Ba glass | α quartz | $Al_2O_3$ | 880° C. | 900° C. | 920° C. |
| A | 23 | 9 | 68 | 5 | 59.8 | 40.2 | 0.0 | 123 | 125 | 126 |
| B | 23 | 9 | 68 | 5 | 58.6 | 34.9 | 6.5 | 112 | 115 | 123 |
| C | 23 | 9 | 68 | 5 | 57.3 | 29.9 | 12.8 | 103 | 109 | 110 |
| D | 23 | 9 | 68 | 5 | 56.2 | 25.1 | 18.7 | 96 | 105 | 103 |
| E | 23 | 9 | 68 | 5 | 55.0 | 20.5 | 24.5 | 88 | 101 | 95 |

The measurement results shown in Table 4 have revealed that in the ceramics composition of the present invention, the linear expansion coefficient can be controlled in a range of $80 \times 10^{-7}/°$ C. to $130 \times 10^{-7}/°$ C. by changing the sintering conditions in the same composition.

13. The ceramics composition according to claim 1, wherein said Ba-based glass comprises 4 to 6 mol of $B_2O_3$ with respect to 100 mol of the total of BaO, $SiO_2$ and $Al_2O_3$.

* * * * *